United States Patent
Ochiai

Patent Number: 5,204,564
Date of Patent: Apr. 20, 1993

[54] VARIABLE DELAY CIRCUIT
[75] Inventor: Katsumi Ochiai, Saitama, Japan
[73] Assignee: Advantest Corporation, Tokyo, Japan
[21] Appl. No.: 916,672
[22] Filed: Jul. 22, 1992
[30] Foreign Application Priority Data Jul. 31, 1991 [JP] Japan .................. 3-192110

[51] Int. Cl.$^5$ ............................. H03C 5/13
[52] U.S. Cl. .................... 307/603; 307/591
[58] Field of Search ........... 307/603, 605, 606, 310; 328/55, 63; 395/550

[56] References Cited
U.S. PATENT DOCUMENTS 4,553,100 11/1985 Nishiura ............... 328/63

Primary Examiner—William L. Sikes
Assistant Examiner—Sinh Tran
Attorney, Agent, or Firm—Staas & Halsey

[57] ABSTRACT

A plurality of delay stages are connected in cascade, each delay stage having a construction in which either one of a path of a delay element utilizing the propagation delay of a gate array and a path not passing through the delay element is selected by a path selector. Each bit of control data is used to control the path selector of the corresponding delay stages. Composite delays are measured for all combinations of such paths, control data which provides a measured composite delay closest to an intended delay corresponding to each set data is determined and is prestored in a main conversion table. A prediction is made, through calculation, as to a delay for each control data when ambient temperature rises $\Delta T°C$. from a temperature $T_0$ at which the main conversion table was produced, the thus predicted delay is used to determine control data which provides a predicted delay closest to an intended delay for each set data, and the relationship between the control data and the set data is prestored in a corrected conversion table. Ambient temperature is detected by temperature detection/control circuit. When the difference $\Delta t$ between the detected temperature and the temperature $t_0$ is $\Delta t < \Delta T°C.$, control data of the main conversion table is selected by a data selector and the path selector of each delay stage is controlled accordingly. When $\Delta t \geq \Delta T°C.$, control data of the corrected conversion table is selected, and the path selector of each delay stage is controlled accordingly.

6 Claims, 4 Drawing Sheets

VARIABLE DELAY CIRCUIT

BACKGROUND OF THE INVENTION

The present invention relates to a variable delay circuit for use in, for example, a timing generator of an IC tester and, more particularly, to a variable delay circuit which is adapted to provide a fine delay corresponding to set data.

FIG. 1 shows a timing generating circuit which forms a part of a timing generator for use in conventional IC testers. One of IC tests is to examine the range of timing over which an IC under test is able to operate correctly, by changing the timing of an input signal to the IC. In such a test, a rate signal $S_R$ of a fixed period (a test cycle period), which has reference timing, is delayed for desired periods of time one after another, by which a timing signal $S_T$ for determining the timing of the input signal to the IC is provided from such a timing generating circuit as shown in FIG. 1. That is, the rate signal $S_R$ of a fixed period, for example, in the range of 10 to 100 ns, which represents reference timing of the test cycle, is provided to a terminal 11S, and in synchronization with this, delay setting data D is provided to a terminal 11D. Data $D_H$ of high order m bits of the delay data D represents a coarse delay in units of the period of a clock CLK shorter than the test cycle, for example, 4 ns or so, and the data $D_H$ is set in a latch circuit 14. Data $D_L$ of low order n bits of the delay data D represents a fine delay which is shorter than the period of the clock CLK, and the data $D_L$ is provided to a fine variable delay circuit 16 to which the present invention pertains.

Upon each application of the rate signal $S_R$ from the terminal 11S, a counter 12 is reset and counts the clock CLK from a terminal 13. When the count value of the counter 12 coincides with the data $D_H$ set in the latch circuit 14, the coincidence is detected by a coincidence detector 15, which outputs a coincidence detection pulse $S_P$. Consequently, the coincidence detection pulse $S_P$ lags behind the rate signal $S_R$ by about $D_H$ (a binary number) times the period of the clock CLK. The coincidence detection pulse $S_P$ is applied to the fine variable delay circuit 16, wherein it is delayed for a time shorter than one period of the clock CLK in accordance with the low n-bit data $D_L$ of the delay setting data D, and the delayed output is provided as a timing signal $S_T$. In this way, the timing signal $S_T$ is generated which is delayed behind the rate signal $S_R$ at the terminal 11S by the period of time corresponding to the set data D.

The fine variable delay circuit 16 comprises a cascade connection of n delay stages 21 in each of which a path selector 19 selects either one of a path which passes through a delay element 17 and a path 18 which does not pass therethrough. The respective path selectors 19 are controlled by corresponding bits of n-bit control data $D_c$ which is provided from a conversion table 22. Usually, the delay elements 17 are each formed by a gate array (AND gates, OR gates, or inverters, or a combination thereof) which provides a desired propagation delay $t_{p\,d}$, that is, the delay stages 21 provide delays having weight $2^0, 2^1, \ldots, 2^{n-1}$ in ascending order. Delays corresponding to all possible paths in the cascade connection of the delay stages 21, that is, delays corresponding to all possible values of the n-bit control data $D_c$ are measured and the relationship between the set data $D_L$ of the desired delay and the control data $D_c$ for controlling the path selector 19 to obtain a measured composite delay closest to the desired delay is obtained in advance, and this relationship is prestored as a conversion table in the conversion table memory 22. In practice, there are written the control data $D_c$ at the corresponding addresses $D_L$ in the conversion able memory 22, using the set data $D_L$ as addresses. In the following description the term "conversion table" may be used to indicate the conversion table memory in some cases. The set data $D_L$ is used as an address to read out the corresponding control data $D_c$ from the conversion table memory 22, and the path selectors 19 are controlled by the corresponding bits of the control data $D_c$ to obtain a composite delay closest to the desired delay corresponding to the set data.

The delay of the delay element 17 varies with a temperature change. On this account, if ambient temperature substantially varies from ambient temperature at which the conversion table 22 was produced, then a large error will be induced in the composite delay which is provided corresponding to the low-order bit data $D_L$ (hereinafter referred to simply as set data). For example, when ambient temperature rises, the delay increases at a fixed rate, whereas when the temperature lowers, the delay decreases at the fixed rate. For instance, assuming that the delay intended to obtain with respect to the set data $D_L = 1001$ is 900 ps, the control data $D_c$ obtainable from the conversion table 22 is 0111 and the actual composite delay obtainable in this case is 875 ps, then the error is 25 ps, but if the composite delay obtainable with the control data 0111 becomes 950 ps due to an increase in ambient temperature, then the error will increase to 50 ps with respect to the intended delay 900 ps.

When such a large error is induced in the composite delay, that is, when ambient temperature varies in excess of a predetermined value, it is conventional to measure the composite delay corresponding to all control data $D_c$ and rewrite the conversion table memory 22 from a control part 10. However, in the case where the number of delay stages 21 is, for example, 10, that is, where the set data $D_L$ is 10-bit, the composite delay must be measured as many as $2^{10}$ times, and consequently, much time is needed to rewrite the conversion table memory 22; therefore, it is difficult, in practice, to rewrite the conversion table memory 22 frequently. Conventionally, the conversion table memory 22 is rewritten, for example, when ambient temperature varies 5° C., but an appreciable large error is induced even by a temperature change within 5° C. Moreover, when ambient temperature undergoes a substantial change relatively quickly, the conversion table memory 22 must be rewritten frequently, and consequently, the variable delay circuit cannot efficiently be used. This problem is particularly serious in the case of employing a number of fine variable delay circuits 16 for setting specified delays with respect to the high-speed rate signal $S_R$ as in the case of a timing generator of an IC tester which requires many timing signals.

SUMMARY OF THE INVENTION

It is therefore an object of the present invention to provide a variable delay circuit which reduces the frequency of rewriting the conversion table, and hence can be utilized efficiently.

According to the present invention, a prediction is made as a delay of each delay stage which varies when temperature changes by a predetermined value from the temperature which satisfies the relationship between set data of main conversion table means and control data, that is, the temperature at which the main conversion table means was produced, and the relationship between the set data and the control data, which provides a predicted composite delay closest to each intended delay, is prestored in corrected conversion table means. When ambient temperature varies in excess of the predetermined value, it is detected by temperature detecting/control means and the corrected conversion table means is selected by the detected output and is used in place of the main conversion table.

DESCRIPTION OF THE PREFERRED EMBODIMENTS

Figure 1:
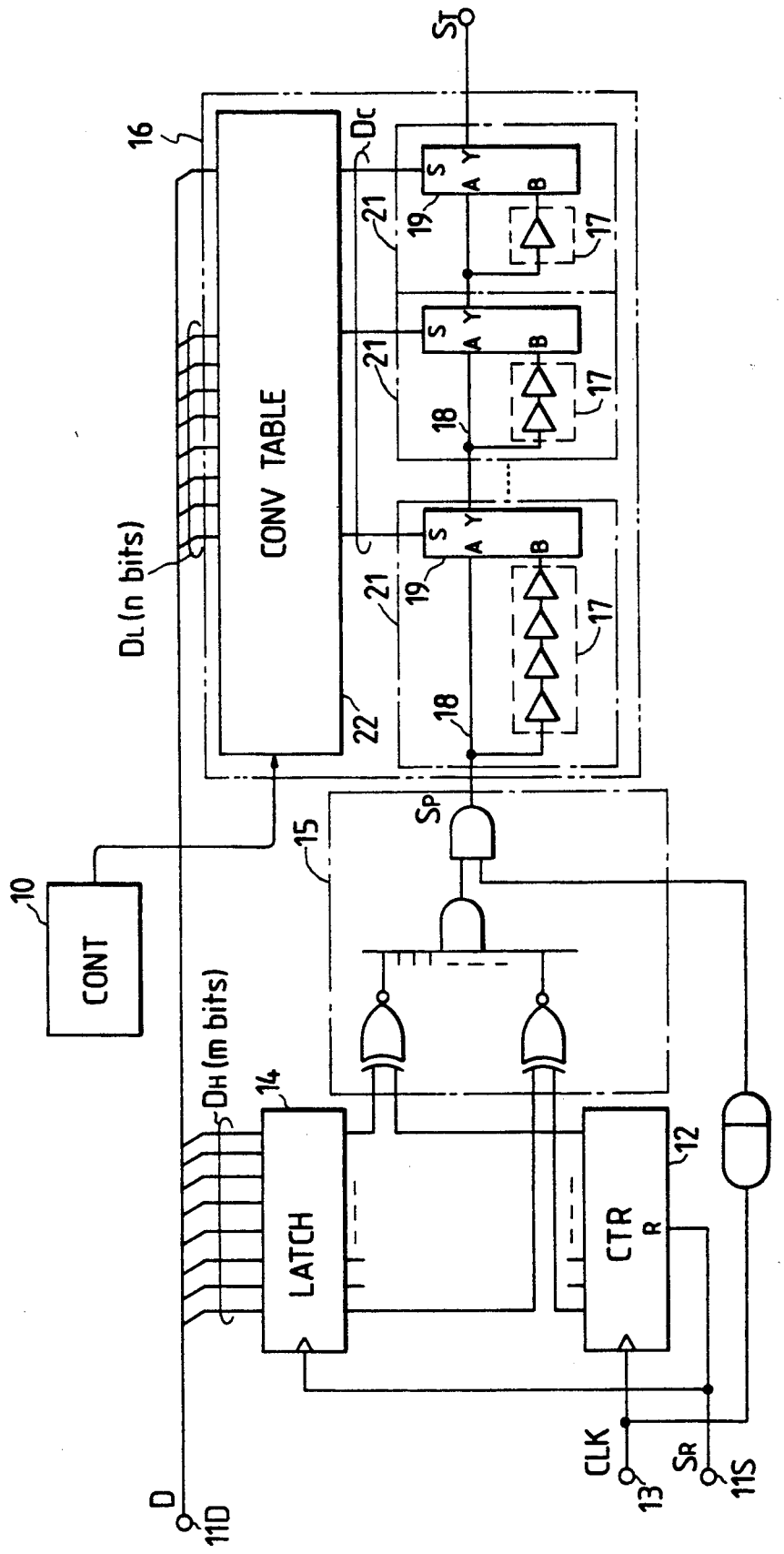
FIG. 1 is a block diagram showing a part of a conventional timing generator used in an IC tester.
Figure 2:
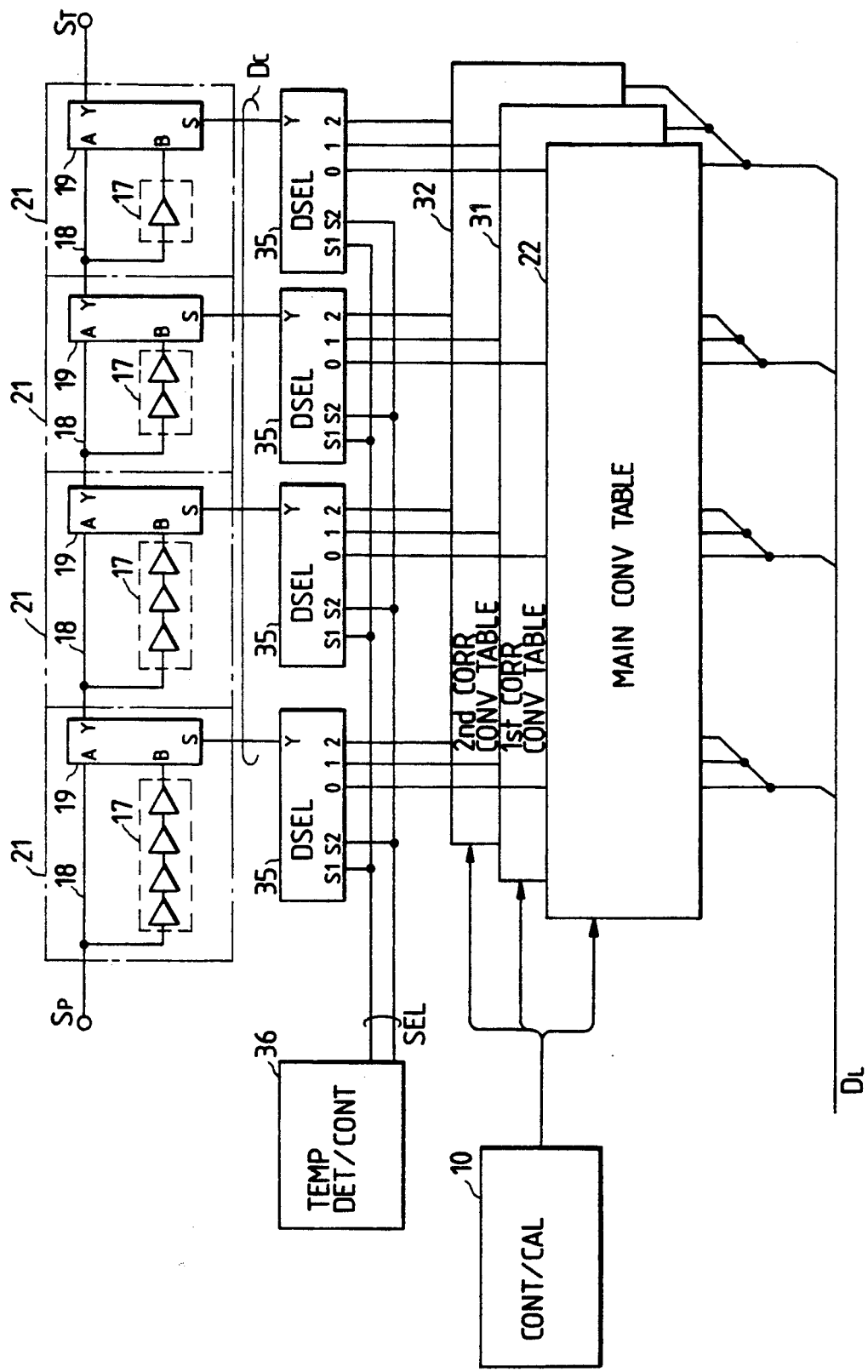
FIG. 2 is a block diagram illustrating an embodiment of the variable delay circuit according to the present invention.

FIG. 2 illustrates in block form an embodiment of the present invention, in which the parts corresponding to those in FIG. 1 are identified by the same reference numerals. This embodiment includes first and second corrected conversion table memories 31 and 32 in addition to a main conversion table memory 22 corresponding to the conversion table memory 22 in FIG. 1. The first corrected conversion table 31 is used in place of the main conversion table 22 when temperature rises more than a predetermined value $\Delta T°$ C. with respect to ambient temperature $T_0$ at which the main conversion table 22 was produced. In general, since the propagation delay $t_{pd}$ of a gate array is substantially in proportion to a temperature change, a prediction is made, by calculation, as to a delay of each delay state 21 which varies when ambient temperature rises $\Delta T°$ C. from $T_0$, and the predicted delays are used to compile a table which represents the relationship between set data and control data. The table thus obtained is prestored as the first corrected conversion table in a first corrected conversion table memory 31.

Figure 3:
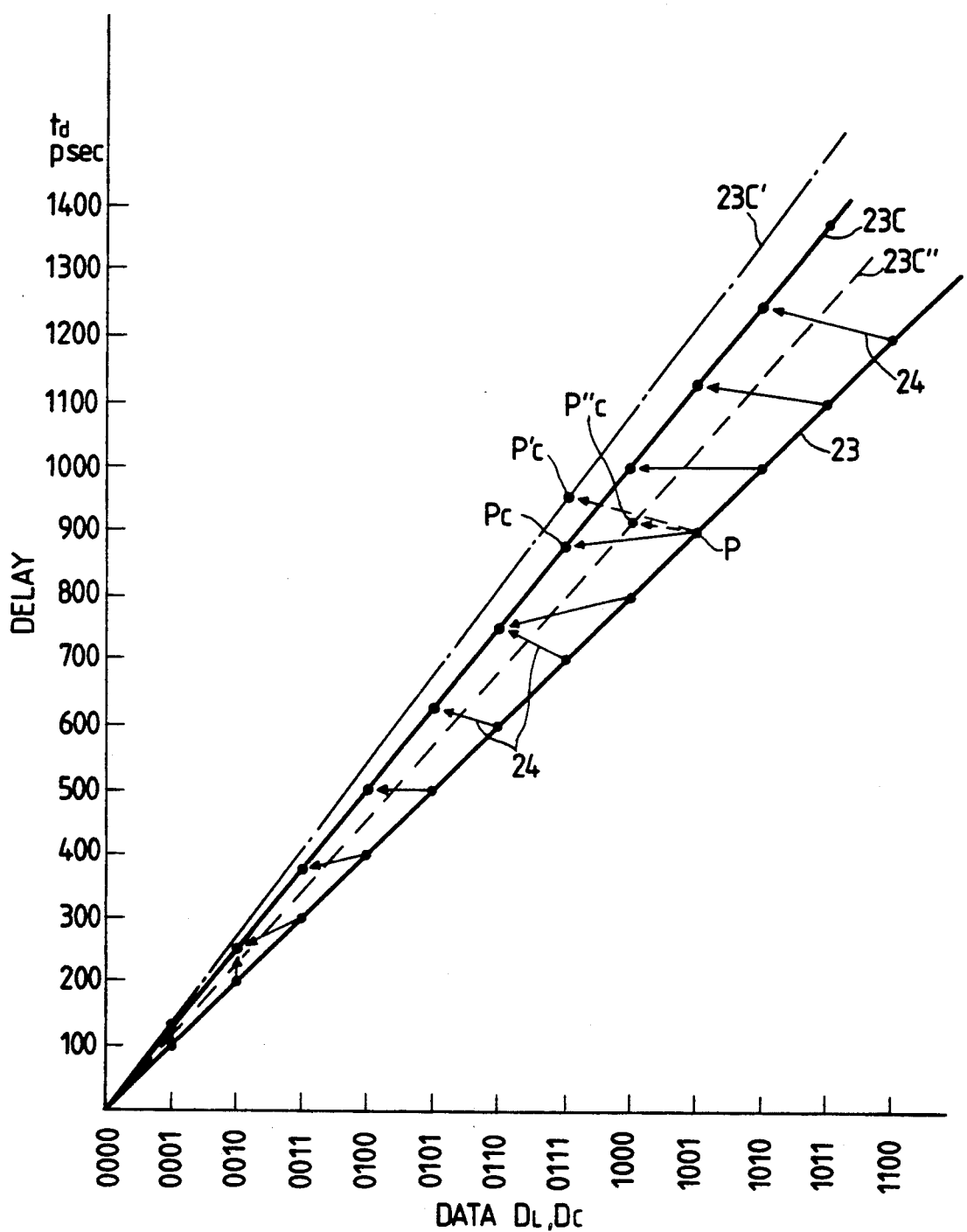
FIG. 3 is a graph showing, by way of example, the relationship between set data and intended delays, between control data and measured composite delays, and between control data and composite delays predicted according to temperature changes.

For example, the relationship between the set data $D_L$ and an intended delay $t_d$ is indicated by black dots on the straight line 23 in FIG. 3. The black dots on the straight line 23 in FIG. 3 each represent an example of the relationship between the set data $D_L$ and the corresponding intended delay $t_d$, and black dots on the line 23C each indicate the relationship between the control data at a certain ambient temperature and the corresponding measured composite delay. The intended delays corresponding to the set data $D_L$ at the respective black dots on the straight line 23 and black dots representing measured composite delays obtainable with the cascade-connected delay stages 21, which are the closest to them, are indicated by arrows 24, respectively. For example, the control data $D_c$, which corresponds to a point $P_c$ at which is provided a measured composite delay closest to the intended delay $t_d = 900$ at a point P corresponding to the set data $D_L = 1001$, is 0111, and in the main conversion table memory 22 there is written at an address 1001 the control data $D_c = 0111$ corresponding to the set data $D_L = 1001$. As regards the other black dots on the straight line 23, too, the corresponding black dots on the line 23C are similarly selected and they are used to determine the set data $D_L$ and the corresponding control data $D_c$, the main conversion table is stored in the memory 22.

It is well-known in the art that when the delay elements 17 are gate arrays, the temperature coefficients of their propagation delays are substantially constant and do not largely scatter. With respect to each piece of the control data $D_c$ on the abscissa in FIG. 3, the number of gates on the selected path between input and output terminals of the variable delay circuit formed by the gate arrays is used to predict, by calculation, the composite delay of the selected path when ambient temperature rises $\Delta T°$ C. from $T_0$. Briefly stated, the measured composite delay corresponding to each control data $D_c$ on the line 23C is multiplied by the temperature coefficient of the propagation delay, and the multiplied output is added to the above-said delay to obtain a predicted delay. Now, assume that the control data $D_c$ and the predicted delay thus obtained bear such a relationship as indicated by the line 23C' in FIG. 3. Next, as in the case of forming the afore-mentioned main conversion table 22, control data which provided a predicted delay which is the closest to the intended delay corresponding to each set data $D_L$ on the line 23 is selected from the points on the line 23C'. For instance, a point $P_{C'}$ at which is provided a predicted delay closest to the intended delay 900 ps corresponding to the set data 1001, is selected from the points corresponding to respective pieces of control data on the line 23C', by which the control data 0111 corresponding to the set data 1001 is determined. In this way, the control data $D_C$ corresponding to each set data $D_L$ is determined, and the corrected conversion table is stored in the corrected conversion table memory 31.

Likewise, a prediction is made as to a composite delay based on the control data $D_C$ when ambient temperature lowers $\Delta T°$ C. from $T_0$. Supposing that the composite delay assumes a value at a point on the line 23C'' in FIG. 3, the predicted delay closest to the intended delay corresponding to each set data on the line 23 is selected from points on the line 23C'', by which the second corrected conversion table representing the relationship between the set data and the control data is written into a second corrected conversion table memory 32. For example, the control data, which provides the predicted delay closest to the intended delay 900 ps corresponding to the set data 1001 expressed by the point P, is selected as a point $P_{C''}$ on the line 23C'' and the control data 1000 is written, as a value corresponding to the set data 1001, at an address 1001 in the second corrected conversion table memory 32. The calculation of predicted delays corresponding to respective pieces of control data $D_C$ on the lines 23C' and 23C'', the formation of the conversion tables and their writes into the conversion table memories 22, 31 and 32 are performed by the control/calculation part 10. The control/calculation part 10 is implemented, for example, as a computer (not shown) for controlling the operation of the IC tester in its entirety. When in FIG. 3 the lines 23C, 23C' and 23C'' are shown to be straight, these lines joining measured or predicted points are not always straight, because the propagation delay time of the gate array forming each delay element 17 somewhat scatters.

Figure 4:
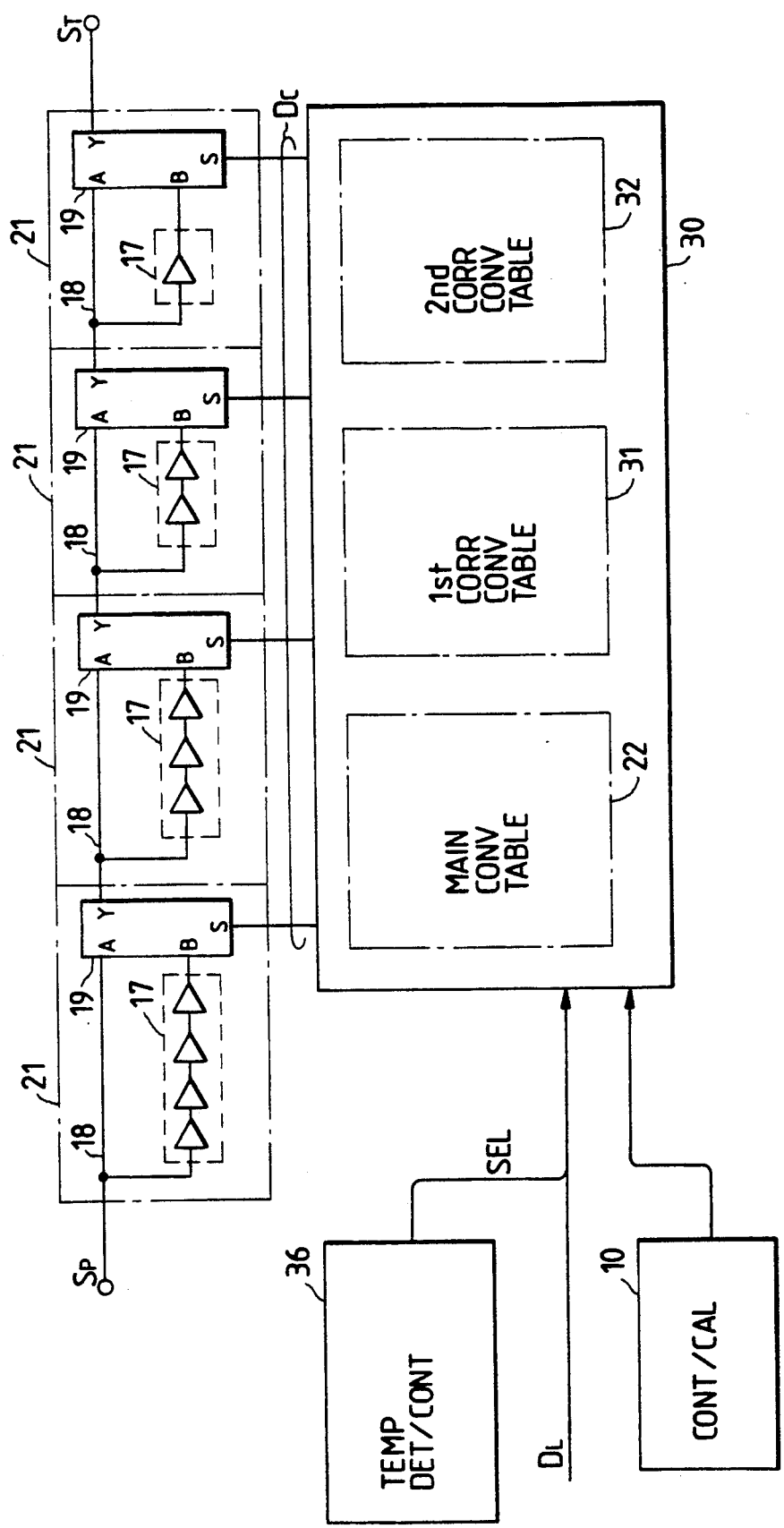
FIG. 4 is a block diagram illustrating another embodiment of the present invention.

The set data $D_L$ is used as an address to read out of the main conversion table memory 22 the corresponding pieces of control data $D_C$ and corresponding bits of the thus read-out control data $D_C$ are provided to corresponding data selectors 35, wherein the same conversion table is selected by a common select control signal SEL, and the selected outputs are applied to the path selectors 19 of the corresponding delay stages 21. A temperature detection/control circuit 36 is provided, which applies the common two-bit select signal SEL to select control terminals S1 and S2 of the data selectors 35 so that they select control data of the main conversion table 22 when the difference $\Delta t$ between ambient temperature detected by the circuit 36 and ambient temperature at which the main conversion table 22 was produced is $-\Delta T° C. < \Delta t < \Delta T° C.$, control data of the first connected conversion table 31 when the difference is $\Delta t \geq \Delta T° C.$ and control data of the second corrected conversion table 32 when the difference is $\Delta t \leq -\Delta T° C.$ FIG. 4 illustrates another embodiment of the present invention, in which the main conversion table 22 and the first and second corrected conversion tables 31 and 32 are all stored in one memory 30. The two-bit select control signal SEL from the temperature detection/control circuit 36 is combined, as high order two bits, with the set data $D_L$ and is provided as an address to the memory 30. The high order two bits are used to select one of the conversion tables 22, 31 and 32, and the corresponding control data $D_C$ in the selected conversion table is read out by the set data $D_L$ which is the low order bit of the address. The respective bits of the control data are provided to the path selectors 19 of the corresponding delay stages 21. This embodiment is identical in construction with the FIG. 1 embodiment except the above.

In the embodiments of FIGS. 2 and 4, when ambient temperature changes more than $2\Delta T° C.$ with respect to the temperature $T_0$, it is possible to measure the composite delay on the basis of all control data $D_C$, correct the relationship between the set data $D_L$ and the control data and rewrite the main conversion table 22 accordingly, as in the prior art. In a work environment in which ambient temperature only rises (or lowers) with respect to the temperature $T_0$ at which the main conversion table 22 was produced, the corrected conversion table 32 (or 31) may be omitted. It is also possible to prepare a corrected conversion table which has prestored therein the afore-mentioned relationship between the set data and the control data when ambient temperature undergoes a $2\Delta T°$ change with respect to the temperature $t_0$. The FIG. 4 embodiment may be constructed so that respective pieces of data in the main conversion table 22 and the corrected conversion tables 31 and 32 are prestored in a memory in the control/calculation part 10 and any one of them is read out therefrom corresponding to ambient temperature and written in the memory 30.

As described above, according to the present invention, a prediction is made as to the relationship between set data and control data when ambient temperature changes by a predetermined value $\Delta T° C.$ and the predicted relationship is prestored in the corrected conversion table. When ambient temperature changes in excess of the predetermined value $\Delta T° C.$, the corrected conversion table is used. This avoids necessity of newly measuring the composite delay and recompiling the conversion table, and hence permits efficient use of the variable delay circuit accordingly. Moreover, if the predetermined value $\Delta T° C.$ is selected smaller than the temperature change for the measurement of the composite delay and the re-compilation of the conversion table in the prior art, for example, 2.5° C. which is one half the temperature 5° C. in the afore-mentioned prior art example, the number of times of recompiling the conversion table the same as in the prior art but delays of higher accuracy can be obtained.

What is claimed is:

1. A variable delay circuit comprising:
   a plurality of cascade-connected delay stages, each including a path passing through a delay element, a path not passing therethrough, and a selector for selecting one of them, said selectors of said delay stages being controlled by corresponding bits of control data to vary a composite delay of said cascade-connected delay stages;
   main conversion table means whereby set data of an intended delay is converted to control data which provides said composite delay closest to said intended delay corresponding to said set data at a first ambient temperature;
   corrected conversion table means wherein predicted delays at a second ambient temperature, different from said first ambient temperature by a predetermined value are stored, the predicted delays being the closest to said intended delay corresponding to each piece of said set data corresponding to said composite delay for said control data at said first ambient temperature; and
   temperature detection/control means which detects ambient temperature and outputs a select control signal for selecting control data from either said main conversion table means and said corrected conversion table means.

2. The variable delay circuit of claim 1 wherein said corrected conversion table means includes a first corrected conversion table for the case where said second ambient temperature is higher than said first ambient temperature by said predetermined value and a second corrected conversion table for the case where said second ambient temperature is lower than said first ambient temperature by said predetermined value.

3. The variable delay circuit of claim 1 wherein said main conversion table means and said corrected conversion table means are formed as a plurality of memories which have stored therein respective conversion tables.

4. The variable delay circuit of claim 1 wherein said main conversion table means and said corrected conversion table means are stored in one memory and the detected output of said temperature detection/control means is used as a high order bit of an address to specify one of said table means.

5. The variable delay circuit of claim 2 wherein said main conversion means and said corrected conversion table means are formed as a plurality of memories which have stored therein respective conversion tables.

6. The variable delay circuit of claim 2 wherein said main conversion table means and said corrected conversion table means are stored in one memory and the detected output of said temperature detection/control means is used as a high order bit of an address to specify one of said table means.

* * * * *

UNITED STATES PATENT AND TRADEMARK OFFICE
CERTIFICATE OF CORRECTION

PATENT NO. : 5,204,564
DATED      : April 20, 1993
INVENTOR(S): Katsumi Ochiai

It is certified that error appears in the above-identified patent and that said Letters Patent is hereby corrected as shown below:

```
* Column 2, line 4, "able" should be --table--.
  Column 6, line 36, "and" should be --or--.
```

Signed and Sealed this

Eleventh Day of January, 1994

Attest:

BRUCE LEHMAN

*Attesting Officer*   *Commissioner of Patents and Trademarks*